United States Patent [19]

Maurer et al.

[11] 4,408,351

[45] Oct. 4, 1983

[54] DIRECTLY MIXING RECEIVING SYSTEM

[75] Inventors: Robert Maurer, Saarbrücken; Alfons Blum, Schiffweiler-Heiligenwald; Michael Hoffmann, Saarbrücken, all of Fed. Rep. of Germany

[73] Assignee: Licentia Patent-Verwaltungs-GmbH, Frankfurt am Main, Fed. Rep. of Germany

[21] Appl. No.: 115,213

[22] Filed: Jan. 25, 1980

[30] Foreign Application Priority Data

Jan. 26, 1979 [DE] Fed. Rep. of Germany ....... 2902952

[51] Int. Cl.³ .............................................. H04B 1/16
[52] U.S. Cl. ................................... 455/260; 455/258; 455/265
[58] Field of Search ............... 455/257, 258, 259, 260, 455/264, 265

[56] References Cited

U.S. PATENT DOCUMENTS

| | | | |
|---|---|---|---|
| 2,715,677 | 8/1955 | Turner | 455/257 |
| 3,101,448 | 8/1963 | Costas | 455/258 |
| 3,163,823 | 12/1964 | Kellis | 455/260 |
| 3,204,185 | 8/1965 | Robinson | 455/265 |
| 3,221,260 | 11/1965 | Henrion | 455/208 |
| 3,564,434 | 2/1971 | Camenzind | 455/208 |
| 3,710,261 | 1/1973 | Low | 455/260 |
| 3,715,757 | 2/1973 | Toman | 455/260 |
| 3,745,255 | 7/1973 | Fletcher | 455/260 |
| 3,768,030 | 10/1973 | Brown | 455/260 |
| 3,934,205 | 1/1976 | Bogert | 455/260 |

OTHER PUBLICATIONS

Phase Locked Loops, by Alain Blanchard, A. Wiley-Interscience Publication, 1976, pp. 241-245.
The Semiconductor Data Library, vol. VI, Motorola Semiconductors Inc., MC1595L MC1495L Multipliers, MC1594L MC 1494L Multipliers.
A Phase Locked AM Radio Receiver, by L. P. Chu, IEEE Transactions on Broadcast and TV Receivers, vol. L%, 1969, pp. 300-308.
Introduction to Operational Amplifier Theory and Applications, by Wait, McGraw-Hill, New York, 1975.
Frequency Synthesis, by V. Kroupa, Griffin & Cie Ltd., London, 1973.

Primary Examiner—Tommy P. Chin
Attorney, Agent, or Firm—Spencer, Kaye & Frank

[57] ABSTRACT

In a broadcast signal receiving system, which includes a phase control loop composed of a first mixer having two inputs and an output and arranged to provide at its output a signal proportional to the product of the signals applied to its two inputs, one output being supplied with the received high frequency signal, a voltage controlled oscillator connected for supplying to the other input of the first mixer an alternating voltage of substantially constant amplitude, a first lowpass filter connected to the output of the first mixer for providing a filtered output signal representative of the first mixer output signal with the sum frequency component of that signal suppressed, and means for delivering the output signal of the first low-pass filter to the control input of the oscillator, the received high frequency signal is directly demodulated by multiplication with a local oscillator signal synchronized to a substantially fixed difference to the phase or the carrier phase of the received high frequency signal.

21 Claims, 20 Drawing Figures

Mixer with differential output

VOLTAGE CONTROLLED OSCILLATOR

FIG.16 Control filter (passive)
PRIOR ART
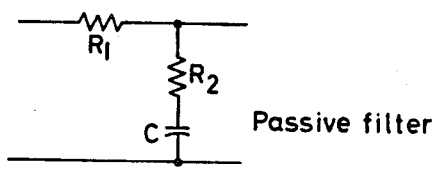
Passive filter
FIG.17 Control filter (active)
PRIOR ART
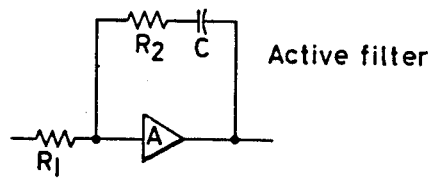
Active filter
FIG.18 Oscillator with quadrature outputs
PRIOR ART
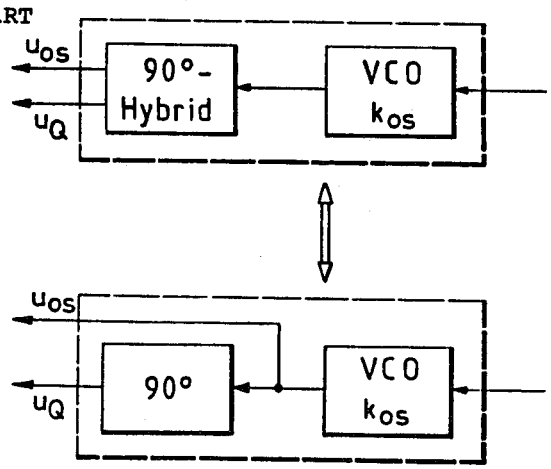

Phase modulator

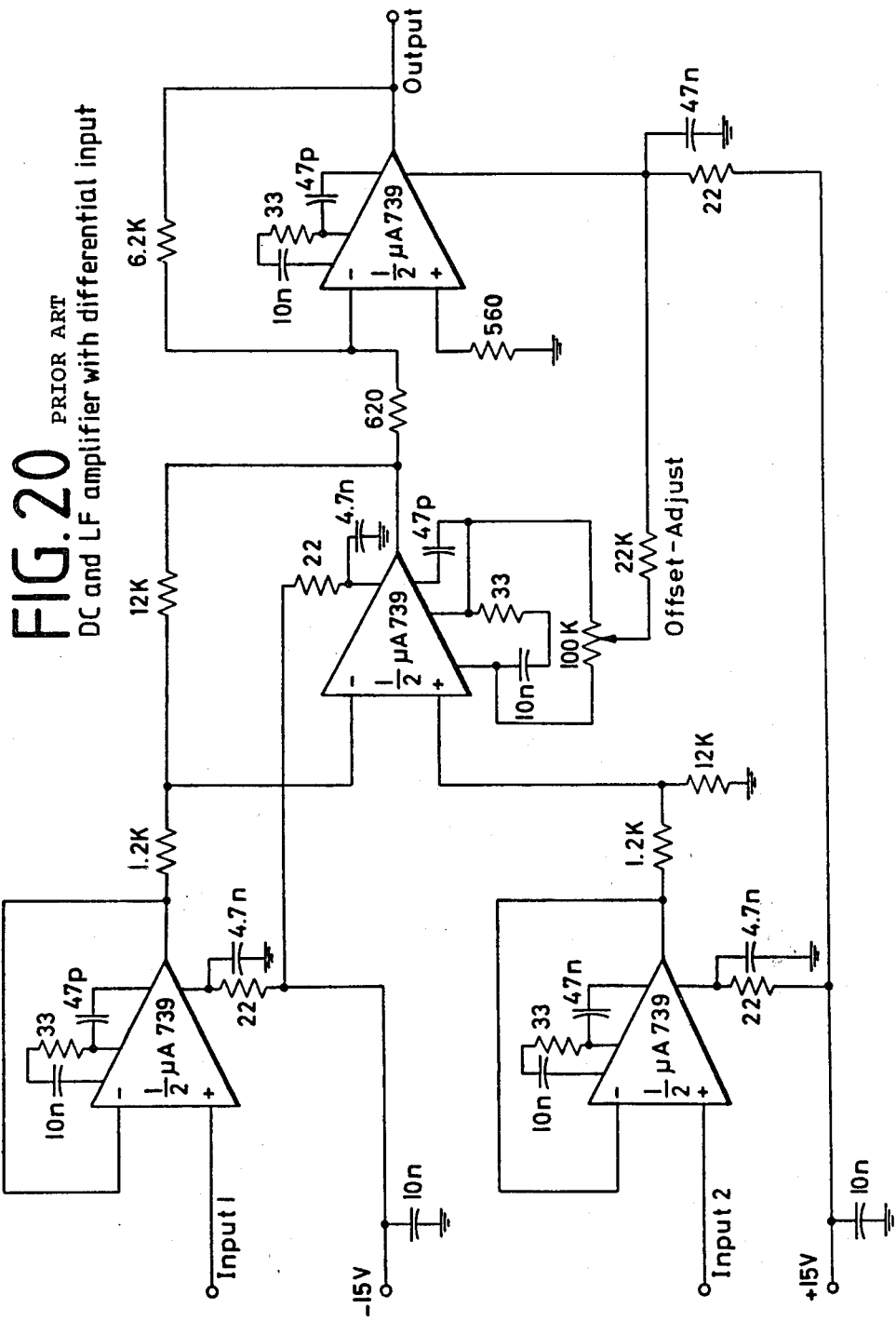

DIRECTLY MIXING RECEIVING SYSTEM

BACKGROUND OF THE INVENTION

The present invention relates in contradistinction to superheterodyne receivers to a directly mixing receiving system in which a high frequency (HF) received signal is converted directly to the base band by multiplication with a synchronized local oscillator signal. The baseband is the frequency band seized by the information to be transmitted, for example the video band from DC to 6 MHz for television or the audioband from 20 Hz to 20 kHz at FM-broadcasting.

Systems of the type to which the invention is directed employ a phase locked loop (PLL) phase control circuit including a mixer connected in series with a lowpass filter for suppressing the portion of the mixed product at the sum frequency and a voltage controlled oscillator (VCO) whose signal frequency or phase can be tuned to or locked on the immediate vicinity of the frequency, or the precise frequency, or a fixed phase difference with respect to the phase of the received HF signal, or of its existing or imaginary carrier.

Such a receiving system is disclosed in the article "Phase Locked AM Radio Receiver" by L. P. Chu in IEEE Transactions on Broadcast and TV Receivers, Vol. 15, 1969, pages 300–308. This receiver employs a complicated Costas phase control loop including a first mixer in which a local oscillator signal in phase with the carrier of the received signal is mixed with the received signal, a first lowpass filter with series-connected low frequency (LF) amplifier, a second mixer in which the local oscillator signal delayed by 90° is mixed with the received signal and which is connected in series with a second lowpass filter and a second LF amplifier, as well as a phase detector which compares the outputs of the two LF amplifiers and feeds the result to a control filter with series-connected varactor which controls the local oscillator. Thus, the Costas control loop includes two control loops, i.e. an "in-phase channel" and a "quadrature channel." The Costas loop is locked in the correct phase if a zero signal is produced in the quadrature channel. The demodulated LF signal can be obtained at the output of the in-phase channel. The circuit is designed to receive double sideband, amplitude modulated, received HF signals as defined by the mathematical derivation of the mode of operation of this synchronous demodulator at page 301, right-hand column. The above-mentioned article does not contain any mention of the usability of such a synchronous demodulator in a system for receiving signals modulated in another manner.

SUMMARY OF THE INVENTION

It is an object of the present invention to adapt a directly mixing synchronous receiving system, with its excellent noise properties, to other types of modulation.

A further object of the invention is to provide inexpensive and optimum circuits and to construct such circuits for any desired types of modulation.

These and other objects are achieved, according to the present invention, in a directly mixing broadcast signal receiving system, in which a received modulated high frequency signal is directly demodulated by multiplication with a synchronized local oscillator signal, which system includes a phase control loop and means connected for delivering the received high frequency signal to the input of the phase control loop, which is composed of a first mixer having two inputs, the one of which is the input of the phase control loop, and an output and arranged to provide at its output a signal proportional to the product of the signals applied to its two inputs, a voltage controlled oscillator connected for supplying to the other input of the first mixer an alternating voltage of substantially constant amplitude, a first lowpass filter connected to the output of the first mixer for providing a filtered output signal representative of the first mixer output signal with the sum frequency component of that signal suppressed, and means for delivering the output signal of the first lowpass filter to the control input of the oscillator for causing the phase of its output signal to be synchronized to a difference of exactly or approximately 90° to the phase of the receiving signal or to the carrier phase of the high frequency signal.

The phase shift of approximately 90° between the received high frequency signal component and the oscillator signal is an inherent property of phase control loops with multiplying mixers (described in: A Blanchard, *Phase Locked Loops,* John Wiley & Sons, New York, 1976, Chapter 10.1.1.).

The directly converting receiving system according to the present invention makes it possible to utilize, in a simple manner, the many advantages of a directly mixing synchronous receiving system also for frequency modulation, phase modulation, phase shift keying and single sideband amplitude modulation. By eliminating intermediate frequency band filters it is possible, for example, to produce, to a much greater degree than heretofore, radio and television receivers according to microelectronic, integrated techniques.

BRIEF DESCRIPTION OF THE DRAWINGS

FIGS. 14–20 are possible embodiments of some block circuits used in the diagrams of FIGS. 2–13.

DESCRIPTION OF THE PREFERRED EMBODIMENTS

Figure 1:
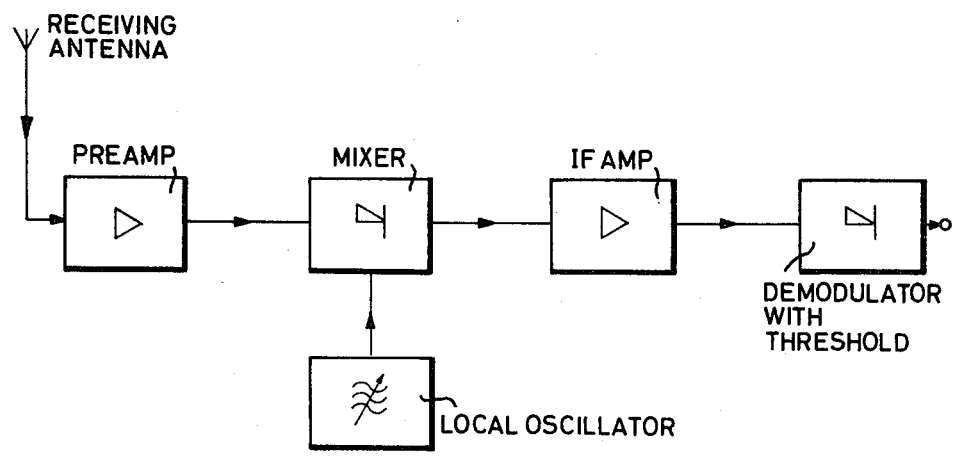
FIG. 1 is a block circuit diagram of a conventional superheterodyne receiver.

FIG. 1 shows, for comparison purposes, a simple superheterodyne receiver including a preamplifier connected to receive the signal supplied by a receiving antenna, a local oscillator, a mixer having inputs connected to the outputs of the preamplifier and the local oscillator, an intermediate frequency amplifier connected to the output of the mixer and a conventional demodulator supplied by the IF amplifier.

Figure 2:
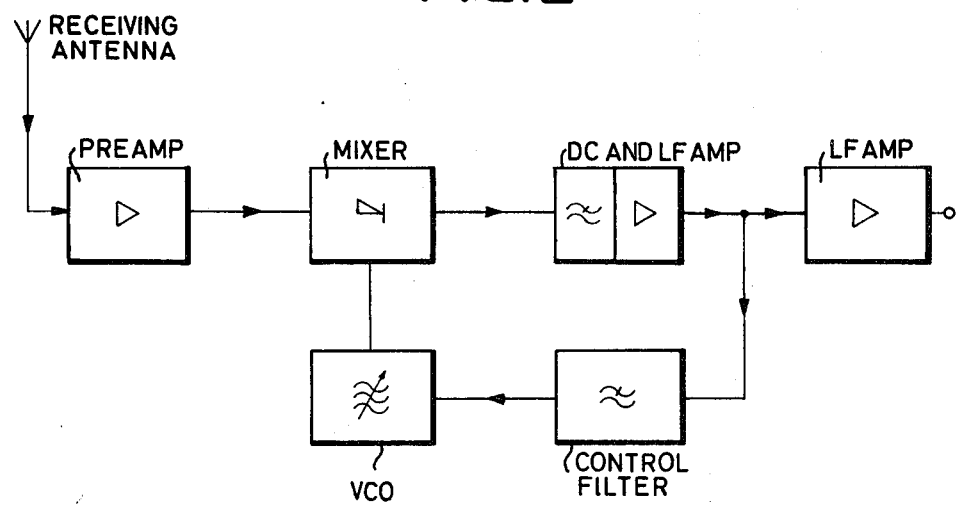
FIGS. 2–8 are block circuit diagrams of preferred embodiments of receivers according to the invention.

FIG. 2, in contrast, illustrates a directly mixing receiver according to the invention which also includes a receiving antenna supplying a preamplifier, as well as a phase control loop composed of a mixer, a d.c. and LF amplifier connected to the mixer output, a control filter connected to receive the output signal from the d.c. and LF amplifier, and a voltage controlled oscillator (VCO) controlled by the output signal from the control filter. A second, LF, amplifier is connected to the output of the d.c. and LF amplifier. The mixer inputs are connected to the preamplifier and VCO outputs.

Figure 3:
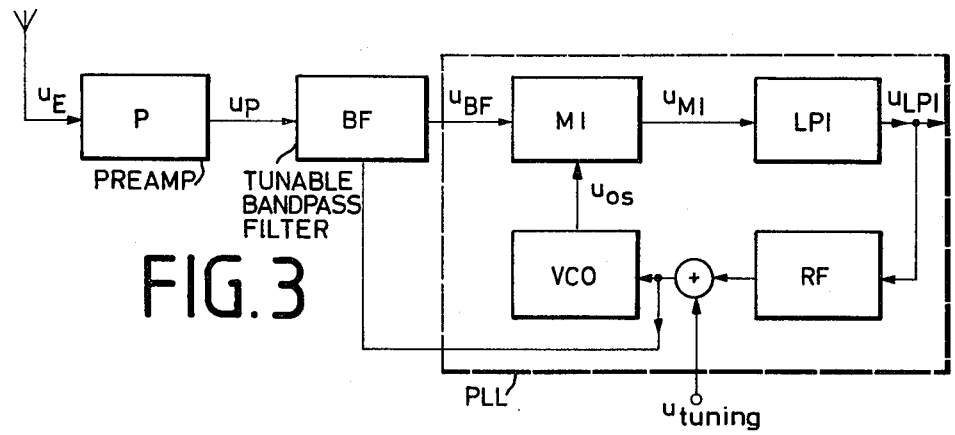

FIG. 3 shows a receiver according to the invention for single sideband amplitude modulated signals with vestigial carrier. The undesirable sideband of the received HF signal $u_E$ amplified to $u_p$ in a preamplifier P, is suppressed, if necessary, in a bandpass filter BF. A mixer M1, lowpass filter LP1, control filter RF and voltage controlled oscillator VCO are connected to form a phase control circuit PLL which settles, or locks, on the vestigial carrier of the input signal. The operation of the receiver according to the invention will now be explained in detail with the aid of its mathematical derivation. The HF signal is assumed to be:

$$u_E(t) = \hat{u}_T \sin(\omega_T t + \Phi_T) + \hat{u}_1 \sin((\omega_T + \omega_{LF})t + \Phi_T + \Phi_{LF}) \quad (1)$$

where
  $\hat{u}_T$ is the peak amplitude of the vestigial carrier,
  $\omega_T$ is the carrier frequency,
  $\hat{u}_1$ is the peak amplitude of the sideband
  $\omega_{LF}$ is the low frequency of the modulation signal and
  $\Phi_T$ and $\Phi_{LF}$ are the phase angles of the carrier and modulation signals, respectively, at time $t = 0$.

At the output of band filter BF there then exists:

$$u_{BF}(t) = k u_E(t). \quad (2)$$

k is the (Frequency dependent) voltage gain of the cascade circuit consisting of the preamplifier and the bandpass filter, the bandwidth of which is at least the transmission bandwidth of the signal to be received, for example 6 MHz for US-television.

The oscillator output signal $u_{os}(t)$, in the settled state, is in quadrature to the vestigial carrier:

$$u_{os}(t) = \hat{u}_{os} \cos(\omega_T t + \Phi_T), \quad (3)$$

where $\hat{u}_{os}$ is the VCO peak output voltage.

The mixer M1 forms the product $$u_{M1}(t) = k_{M1} u_{BF}(t) u_{os}(t) \quad (4)$$

$$= \tfrac{1}{2} k_{M1} k \hat{u}_{os} \{ (\hat{u}_T \sin(2\omega_T t + 2\Phi_T) + \hat{u}_1 \sin(\omega_{LF} t + \Phi_{LF}) + \hat{u}_1 \sin((2\omega_T + \omega_{LF})t + 2\Phi_T + \Phi_{LF}))\},$$

where $k_{M1}$ is the mixer voltage gain.

The lowpass filter LP1 suppresses the product portion of the double carrier frequency and the desired information is retained at the output of the lowpass filter:

$$u_{LP1}(t) = \tfrac{1}{2} k_{M1} k \hat{u}_{os} \hat{u}_1 \sin(\omega_{LF} t + \Phi_{LF}). \quad (5)$$

In order to tune the receiver to a desired broadcast frequency, an adder is interposed between control filter RF and oscillator VCO and a tuning voltage $U_{tuning}$ generated in a conventional manner is supplied to the adder, where it is summed with the control filter output. The summed signal is supplied, in a conventional manner, to effect tuning of bandpass filter BP as well as of oscillator VCO.

Figure 4:
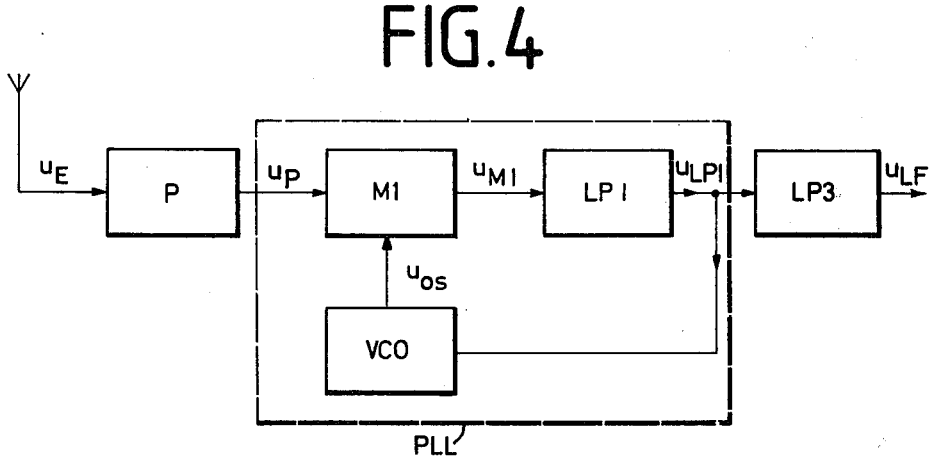

FIG. 4 shows the block circuit diagram of a directly mixing FM receiver. The circuit includes a preamplifier P and a broadband PLL composed of a mixer M1, lowpass filter LP1 and voltage controlled oscillator VCO. Thus, the receiver does not require a limiter amplifier and the complicated preselection and after selection heretofore associated therewith is eliminated. A further lowpass filter LP3 at the LF side serves to increase selectivity. This FM receiver and its operation will also be explained in detail with the aid of a mathematical derivation. The following signal is considered to be present at the output of preamplifier P:

$$u_P(t) = \hat{u}_P \sin\left( \omega_T t + \Delta\Omega \int_0^t s(\tau) d\tau + \Phi_T \right), \quad (6)$$

where $u_P$ is the peak voltage of the preamplified signal, $s(\tau)$ is the low frequency modulation signal, $\tau$ an integration variable and $\Delta\Omega$ is the maximum frequency deviation from $\omega_T$, the remaining terms being as defined above.

The oscillator signal may be defined as:

$$u_{os}(t) = \hat{u}_{os} \cos\left( \omega_{os} t + k_{os} \int_0^t u_{LP1}(\tau) d\tau + \Phi_{os} \right), \quad (7)$$

where $\omega_{os}$, $k_{os}$ and $\Phi_{os}$ are the VCO output residual frequency, modulation sensitivity, and phase angle at time $t=0$, respectively. To receive $u_p(t)$, $\omega_{os}$ has to be tuned to $\omega_T$. In the settled case, $\Phi_{os}$ becomes approximately $\Phi_T$. The signal $$u_{M1}(t) = k_{M1} u_P(t) u_{os}(t) \quad (8)$$

$$= \tfrac{1}{2} k_{M1} \hat{u}_P \hat{u}_{os} \sin\left( \int_0^t (\Delta\Omega s(\tau) - k_{os} u_{LP1}(\tau)) d\tau + \Phi_T - \Phi_{os} \right) + \tfrac{1}{2} k_{M1} \hat{u}_P \hat{u}_{os} \sin\left( \int_0^t (\Delta\Omega s(\tau) + k_{os} u_{LP1}(\tau)) d\tau + \Phi_T + \Phi_{os} + 2\omega_T t \right).$$

is then present at the output of the mixer M1.

The lowpass filter LP1 suppresses the voltage component at the sum frequency, leaving $$u_{LP1}(t) = \tfrac{1}{2} k_{M1} \hat{u}_P \hat{u}_{os} \sin\left( \int_0^t (\Delta\Omega s(\tau) - k_{os} u_{LP1}(\tau)) d\tau + \Phi_T - \Phi_{os} \right). \quad (9)$$

In the locked case, the argument of the angle function becomes very small. Thus the following applies in good approximation:

$$u_{LP1}(t) = \tfrac{1}{2} k_{M1}\hat{u}_V\hat{u}_{os}\left( \int_0^t (\Delta\Omega s(\tau) - \right. \tag{10}$$

$$\left. k_{os}u_{LP1}(\tau)d\tau + \Phi_T - \Phi_{os} \right).$$

By using the abbreviated notation $$\omega_p = \tfrac{1}{2} k_{M1} k_{os} \hat{u}_V \hat{u}_{os}$$

equation (10), when differentiated, provides the following:

$$\dot{u}_{LP1}(t)/\omega_p + u_{LP1}(t) = \Delta\Omega s(t)/k_{os}. \tag{11}$$

But this is the differential equation of a first order lowpass filter with the limit frequency $\omega_p/2\pi$, which is actuated by the signal $\Delta\Omega s(t)/k_{os}$. With a sufficiently high limit frequency $\omega_p/2\pi$, $u_{LP1}(t)$ is thus the demodulated low frequency information. The lowpass filter LP3 provides increased selectivity. The limit frequencies of the lowpass filters LP1 and LP3 and $\omega_p/2\pi$ must be higher than the maximum information frequency to be transmitted to not distort the information. The limit frequency of LP3 should not be much higher than the maximum information frequency.

Figure 5:
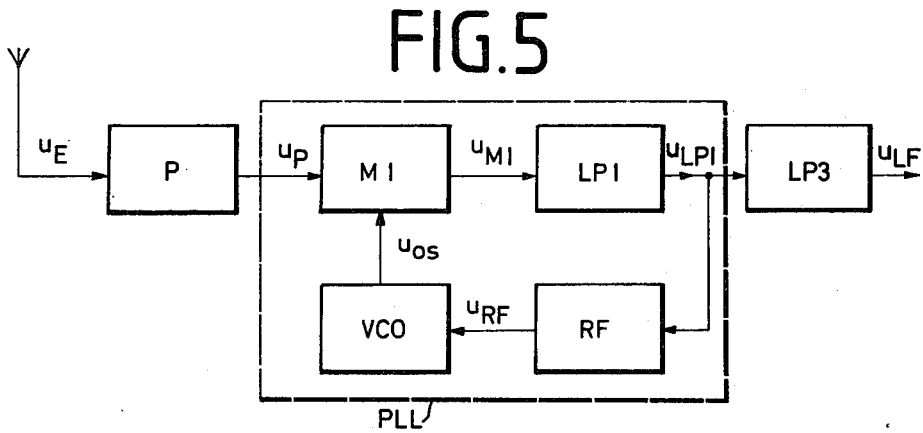

A further embodiment of the invention is the receiver circuit shown in FIG. 5, which can be used to demodulate phase modulated signals which have a small maximum phase deviation. It includes a preamplifier P and a narrow band PLL composed of mixer M1, lowpass filter LP1, control filter RF and voltage controlled oscillator VCO. The lowpass filter LP3 serves the same purpose as in the circuit according to FIG. 4.

The operation of this embodiment will also be explained mathematically. The received HF signal is assumed to be $$u_p(t) = \hat{u}_V \sin(\omega_T t + \Phi_T + \Phi(t)), \tag{12}$$

where $\Phi(t)$ is the phase excursion.

If the VCO of the narrowband PLL settles on the carrier spectral line of the phase modulated signal, the following applies:

$$u_{os}(t) = \hat{u}_{os} \cos(\omega_T t + \Phi_T). \tag{13}$$

Consequently, the voltage $$u_{M1}(t) = k_{M1} u_p(t) u_{os}(t) \tag{14}$$

$$= \tfrac{1}{2} k_{M1} \hat{u}_V \hat{u}_{os}\{\sin\Phi(t) + \sin(2\omega_T t + 2\Phi_T + \Phi(t))\}.$$

is present at the output of the mixer M1.

In the lowpass filter LP1 the voltage component at the sum frequency is suppressed and the lowpass filter output voltage is then
$$u_{LP1}(t) = \tfrac{1}{2} k_{M1} \hat{u}_V \hat{u}_{os} \sin \Phi(t). \tag{15}$$

For phase excursions $\Phi(t)$ which are small compared to 1, the following applies in good approximation:
$$u_{LP1}(t) = \tfrac{1}{2} k_{M1} \hat{u}_V \hat{u}_{os} \Phi(t), \tag{16}$$

i.e. the demodulated low frequency information.

Figure 12:
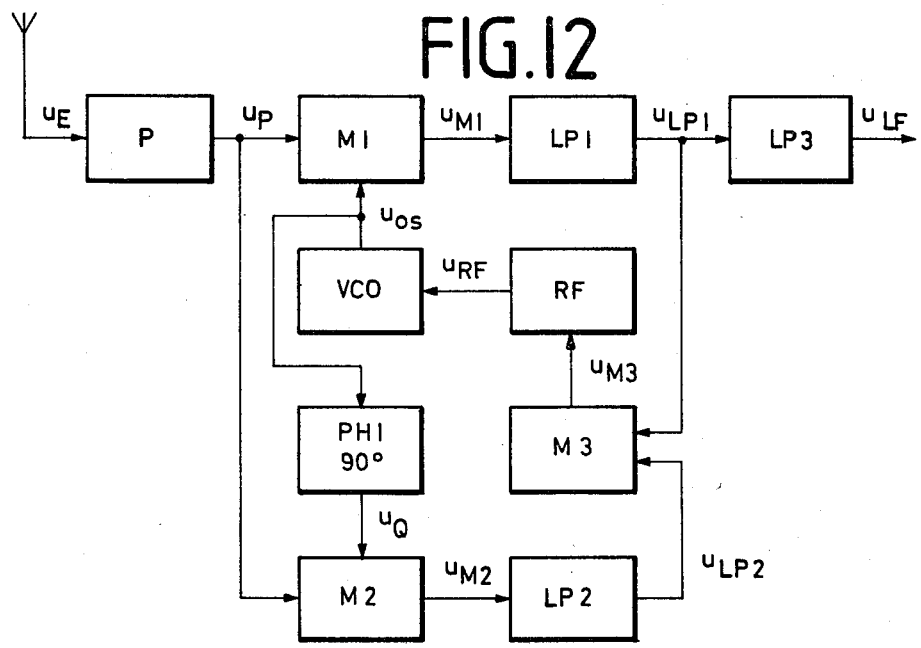

FIG. 12 shows a circuit with Costas loop with which also phase modulated signals of low rise with or without carrier spectral lines in the input spectrum can be demodulated. This circuit is in contradistinction to the circuit of FIG. 5 also well suited for the demodulation of n fold PSK (Phase Shift Keying) signals.

Figure 6:
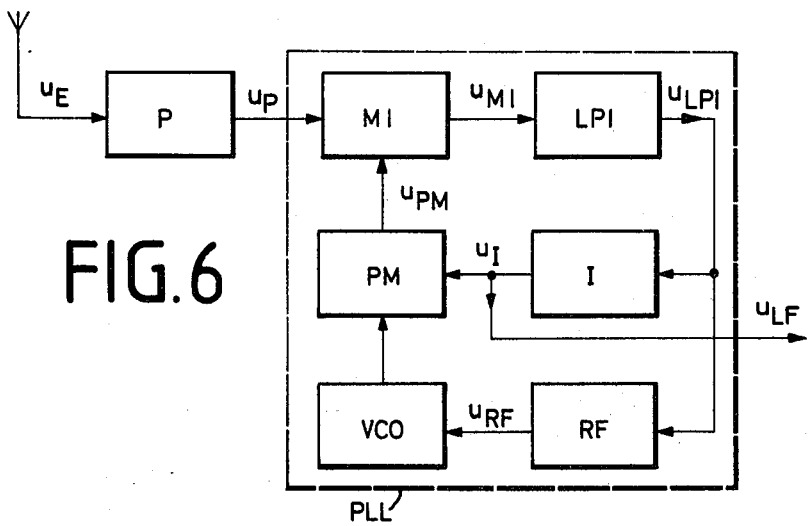

A further embodiment of the invention is shown in FIG. 6 which is well suited for the reception of phase modulated signals with larger phase excursions. The circuit includes a preamplifier P and a modified narrowband PLL containing a mixer which receives at its second input, as the mixing signal, the output signal from oscillator VCO which has been modulated with the low frequency signal in a phase modulator PM which is part of the phase control loop. The demodulated LF signal is available at the output of an integrator I connected in series between the lowpass filter LP1 and the modulation input of modulator PM. The operation of this circuit will now be explained by way of a mathematical derivation. The preamplified phase modulated signal is assumed to be $$u_p(t) = \hat{u}_V \sin(\omega_T t + \Phi(t) + \Phi_T). \tag{17}$$

The signal generated by the voltage controlled oscillator VCO is assumed to be $$u_{os}(t) = \hat{u}_{os} \cos\left(\omega_T t + k_{os} \int_0^t u_{RF}(\tau) d\tau + \Phi_{os}\right), \tag{18}$$

where $u_{RF}$ is the output voltage of the control filter RF which is a slowly variable value. The control filter is a lowpass filter with a limit frequency, which has to be less than the minimum information frequency to be transmitted.

The oscillator signal is modulated in the phase modulator PM with the output voltage $u_I(t)$ of the integrator I, yielding:

$$u_{PM}(t) = \hat{u}_{PM} \cos\left(\omega_T t + k_{os} \int_0^t u_{RF}(\tau) d\tau + \Phi_{os} + k_p u_I(t)\right), \tag{19}$$

where $k_p$ is the modulation sensitivity of the phase modulator PM. At the output of the mixer M1 there is then generated the voltage $$u_{M1}(t) = k_{M1} u_{PM}(t) u_p(t) \tag{20}$$

$$= \tfrac{1}{2} k_{M1} \hat{u}_{PM} \hat{u}_V \left( \sin\left\{ \Phi(t) + \Phi_T - k_{os} \int_0^t u_{RF}(\tau) d\tau - \Phi_{os} - k_p u_I(t) \right\} + \sin\left\{ 2\omega_T t + \Phi(t) + \Phi_T + k_{os} \int_0^t u_{RF}(\tau) d\tau + \Phi_{os} + k_p u_I(t) \right\} \right).$$

The lowpass filter LP1 suppresses the voltage component at the sum frequency and the following results:

$$u_{LP1}(t) = \tfrac{1}{2} k_{M1} u_{PM} \hat{u}_V \sin\left( \Phi(t) + \Phi_T - k_{os} \int_0^t u_{RF}(\tau)d\tau - \Phi_{os} - k_p u_I(t) \right). \quad (21)$$

When the control loop locks, the argument of the sine function in equation (21) becomes very small compared to 1, i.e. sin $\Phi \rightarrow \Phi$, and moreover, due to the quadrature requirement, the following tendency arises:

$$k_{os} \int_0^t u_{RF}(\tau)d\tau + \Phi_{os} \rightarrow \Phi_T \quad (22)$$

The following then applies:

$$u_{LP1}(t) = \tfrac{1}{2} k_{M1} \hat{u}_{PM} \hat{u}_V \{\Phi(t) - k_p u_I(t)\}. \quad (23)$$

The voltage $u_I$ is the result of integration from the voltage $u_{LP1}$:

$$u_{LP1}(t) = \dot{u}_I(t)/k_I \quad (24)$$

where $k_I$ is the transfer characteristic of integrator I.

Using the abbrevation $$\omega_{pp} = \tfrac{1}{2} k_p k_{M1} k_I \hat{u}_{PM} \hat{u}_V, \quad (25)$$

differentiation of equation (23) will then produce $$\dot{u}_I(t)/\omega_{pp} + u_I(t) = \Phi(t)/k_p) \quad (26)$$

which corresponds to the differential equation of a lowpass filter at the limit frequency $\omega_{pp}/2\pi$ and the input signal $\Phi(t)/k_p$. With a sufficiently high limit frequency, (i.e. higher than the maximum information frequency to be transmitted) $u_I(t)$ is thus the demodulated signal. If the phase modulator PM has high linearity and is poor in harmonics at the output, this demodulation circuit is impressive by its high degree of freedom from distortion and noise.

Figure 7:
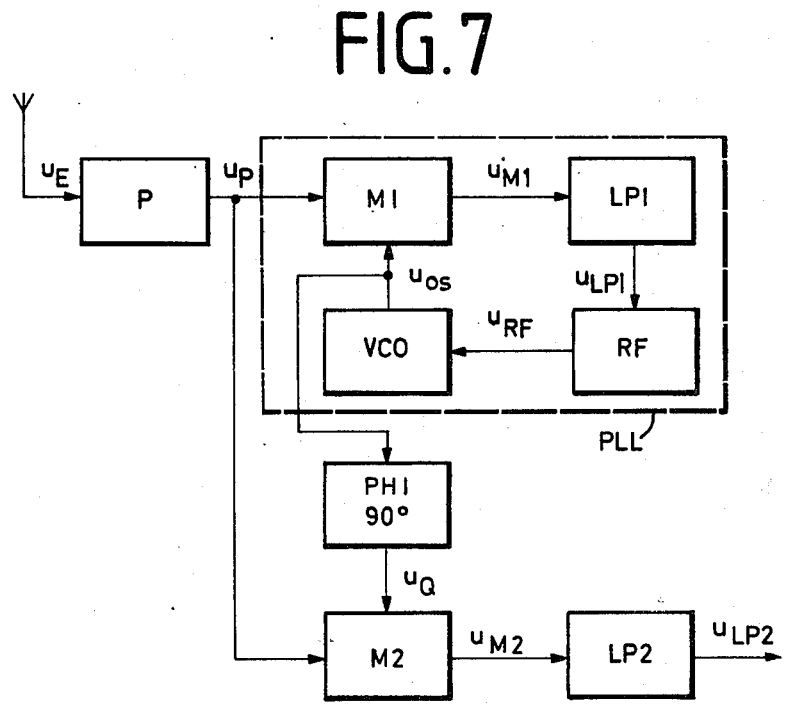

According to a further embodiment of the invention, as shown in FIG. 7, double sideband amplitude modulation can be processed. The circuit includes a narrowband phase control loop PLL in which the oscillator signal is in quadrature to the carrier, and additionally a second mixer which receives the oscillator signal after it has been shifted by 90° in a phase shifter PH1, i.e. to be in phase with the carrier, and the received preamplified HF signal, and at whose series-connected lowpass filter LP2 the demodulated LF signal can be obtained.

The operation of this circuit will be explained below with a mathematical derivation. The received signal as amplified in preamplifier P is assumed to be $$u_p = \hat{u}_V (1 + m(t)) \sin(\omega_T t + \Phi_T), \quad (27)$$

where $m(t)$ is the instantaneous modulating function value. From the oscillator signal in quadrature to the carrier, $$u_{os}(t) = \hat{u}_{os} \cos(\omega_T t + \Phi_T), \quad (28)$$

there then results at the phase shifter PH1 output the signal $$u_Q(t) = \hat{u}_{os} \sin(\omega_T t + \Phi_T). \quad (29)$$

This signal is multiplied in mixer M2 with the signal $u_p$, the result being $$u_{M2}(t) = k_{M2} u_Q(t) u_p(t) \quad (30)$$
$$= \tfrac{1}{2} k_{M2} \hat{u}_V \hat{u}_{os} (1 + m(t))\{1 - \cos(2\omega_T t + 2\Phi_T)\}.$$

The lowpass filter LP2 suppresses the mixing product component at the sum frequency and the result is:

$$u_{LP2}(t) = \tfrac{1}{2} k_{M2} \hat{u}_V \hat{u}_{os} (1 + m(t)). \quad (31)$$

The alternating voltage component of this signal is the desired demodulated information.

Figure 8:
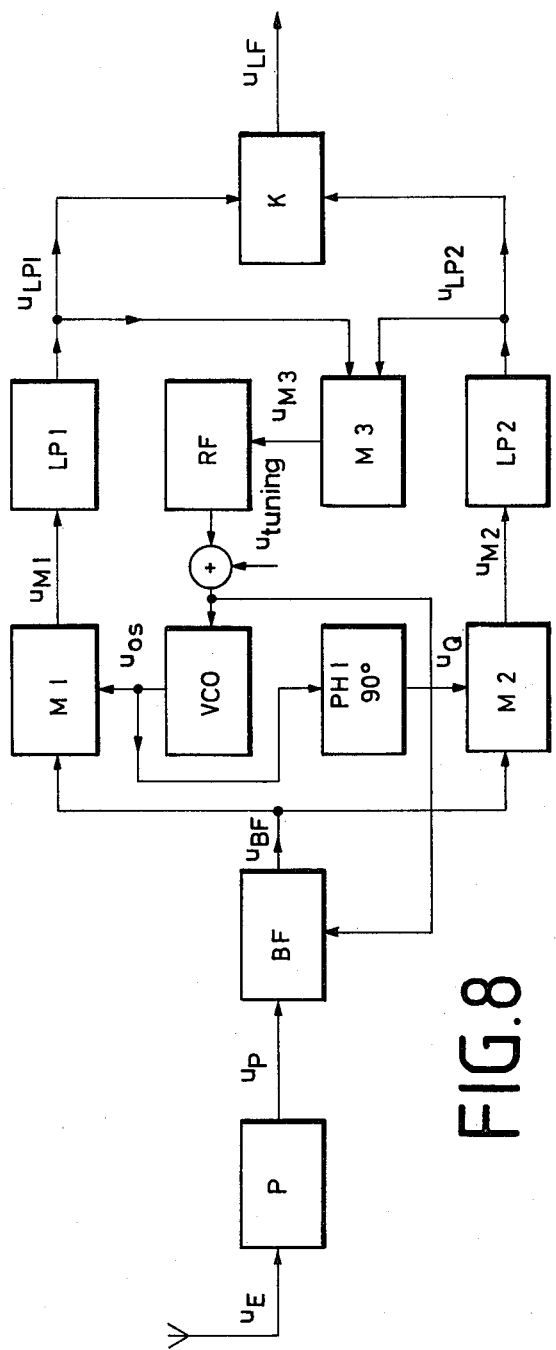

A circuit which can demodulate double sideband as well as single sideband AM transmissions is shown in FIG. 8. The input signal $u_E$ is amplified in a preamplifier P. In the subsequent tunable bandpass filter BF, undesired frequencies are suppressed, for example the undesired sideband. The band filter output signal $u_{BF}$ is fed to a Costas loop which includes mixers M1, M2 and M3, lowpass filters LP1 and LP2, control filter RF, voltage controlled oscillator VCO and 90° phase shifter PH1. In the case of a double sideband, amplitude modulated signal, or in the case of a single sideband, amplitude modulated signal, where in the frequency position of the suppressed sideband a possible interference signal is suppressed sufficiently strongly by the bandfilter BF the demodulated signal can be obtained from the lowpass filter LP2. In the case of single sideband, amplitude modulated signal in which interfering signals are still present behind the band filter BF in the image frequency position, a compensation of the interference signals must take place. The signal at the band filter output is assumed to be $$u_{BF}(t) = \hat{u}_1 \cos(\omega_T t + \Phi_T) + \hat{u}_2 \cos((\omega_T + \omega_{LF})t + \Phi_T \Phi_{LF}) + \hat{u}_3 \cos((\omega_T - \omega_{st})t + \Phi_T - \Phi_{st}). \quad (32)$$

The following then applies for the settled Costas loop:

$$u_{os}(t) = \hat{u}_{os} \sin(\omega_T t + \Phi_T) \quad (33)$$

$$u_Q(t) = \hat{u}_{os} \cos(\omega_T t + \Phi_T). \quad (34)$$

With the mixer gains $k_{M1}$ and $k_{M2}$, there then appears at the mixer outputs $$u_{M1}(t) = u_{BF}(t) u_{os}(t) k_{M1} \quad (35)$$

$$u_{M2}(t) = u_{BF}(t) u_Q(t) k_{M2}. \quad (36)$$

With identical mixer gains $k_{M1} = k_{M2}$ and with suppression of the mixed product components at the sum frequencies by means of lowpass filters LP1 and LP2, respectively, the following voltages are present at the outputs of the lowpass filters:

$$u_{LP1}(t) = -\tfrac{1}{2} k_{M1} \hat{u}_{os} \hat{u}_2 \sin(\omega_{LF} t + \Phi_{LF}) + \tfrac{1}{2} k_{M1} \hat{u}_{os} \hat{u}_3 \sin(\omega_{st} t + \Phi_{st}) \quad (37)$$

$$u_{LP2}(t) = +\tfrac{1}{2} k_{M1} \hat{u}_{os} \hat{u}_2 \cos(\omega_{LF} t + \Phi_{LF}) + \tfrac{1}{2} k_{M1} \hat{u}_{os} \hat{u}_3 \cos(\omega_{st} t + \Phi_{st}) + \tfrac{1}{2} k_{M1} \hat{u}_{os} \hat{u}_1. \quad (38)$$

Thus the upper sideband $\omega_{LF}$ as well as the lower sideband $\omega_{st}$ are generated at both lowpass filter outputs. One of the two sidebands, for example the lower sideband $\omega_{st}$, can be suppressed by compensation due to the fixed phase relationship between the voltages $u_{LP1}$ and $u_{LP2}$. The compensation takes place in the compensation block K, for example in the manner that the signals $u_{LP1}$ and $u_{LP2}$ are shifted by a further 90° with respect to one another. By adding or subtracting these signals, the undesired sideband signal is compensated.

Figure 9:
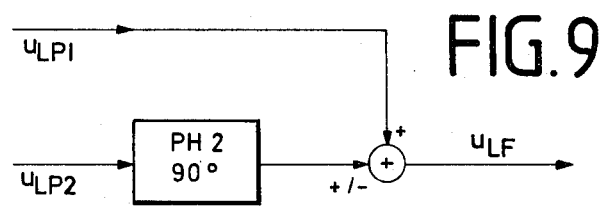
FIGS. 9 and 10 are block diagrams of two embodiments of a component of the circuit of FIG. 8.

One simple arrangement for effecting such compensation is shown in FIG. 9 in which the output signal from filter LP2 is shifted in phase by 90° in a phase shifter PH2 and the shifted signal is added to or subtracted from the output signal from filter LP1. This method of compensation, however, has the drawback that the entire LF spectrum must be shifted in phase over a broad band.

Figure 10:
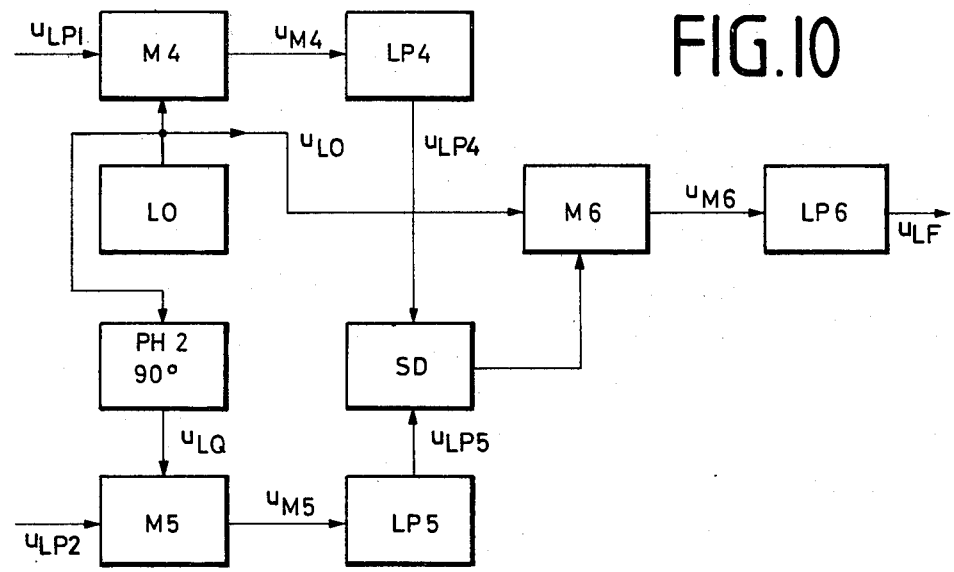

FIG. 10 shows an embodiment of a compensation block K which avoids this drawback and operates with a fixed frequency phase shifter PH2. The circuit, which has the lowpass filter outputs connected to its two inputs, generates, with mixers M4 and M5, fixed frequency local oscillator LO and the 90° phase shifter PH2 and lowpass filters LP4 and LP5, single sideband signals which are bound to one another in rigid phase position and with the upper sideband suppressed. For this purpose, the lowpass filters must be highly selective. Advisably the radian frequency $\Omega$ of the local oscillator LO is therefore set only slightly above the maximum low frequency. With the local oscillator signal $$u_{LO}(t) = \hat{u}_{LO} \cos (\Omega t + \Psi) \quad (39)$$

and the signal at the output of the phase shifter PH2

$$u_{LQ}(t) = \hat{u}_{LO} \sin (\Omega t + \Psi) \quad (40)$$

which is in quadrature to $u_{LO}(t)$, the voltages $$u_{LP4}(t) = A\{\hat{u}_2 \sin ((\Omega - \omega_{LF})t + \Psi - \Phi_{LF}) - \hat{u}_3 \sin ((\Omega - \omega_{st})t + \Psi - \Phi_{st})\} \quad (41)$$

$$u_{LP5}(t) = A\{\hat{u}_2 \sin ((\Omega - \omega_{LF})t + \Psi - \Phi_{LF}) + \hat{u}_3 \sin ((\Omega - \omega_{st})t + \Psi - \Phi_{st}) + 2\hat{u}_1 \sin (\Omega t + \Psi)\}. \quad (42)$$

are obtained at the outputs of the lowpass filters LP4 and LP5, respectively, where $A = \frac{1}{4}k_{M1}k_{M4}\hat{u}_{os}\hat{u}_{LO}$ is a constant. $k_{M4}$ is the voltage gain of the mixers M4 and M5.

By forming the sum or difference of these signals in an arithmetic unit SD, the undesirable sideband is compensated. The following applies for the sum formation:

$$u_{SD}(t) = 2A\hat{u}_2 \sin ((\Omega - \omega_{LF})t + \Psi - \Phi_{LF}) + 2A\hat{u}_1 \sin (\Omega t + \Phi) \quad (43)$$

which constitutes a single sideband signal without interfering signal in the image frequency position.

Demodulation of that signal is then effected in a circuit which operates analogously to the circuit of FIG. 3. Since, however, the carrier is already available, this portion of the circuit is simplified to a mixer M6, behind which there is connected a lowpass filter LP6 at whose output the desired information is present without interference.

Figure 11:
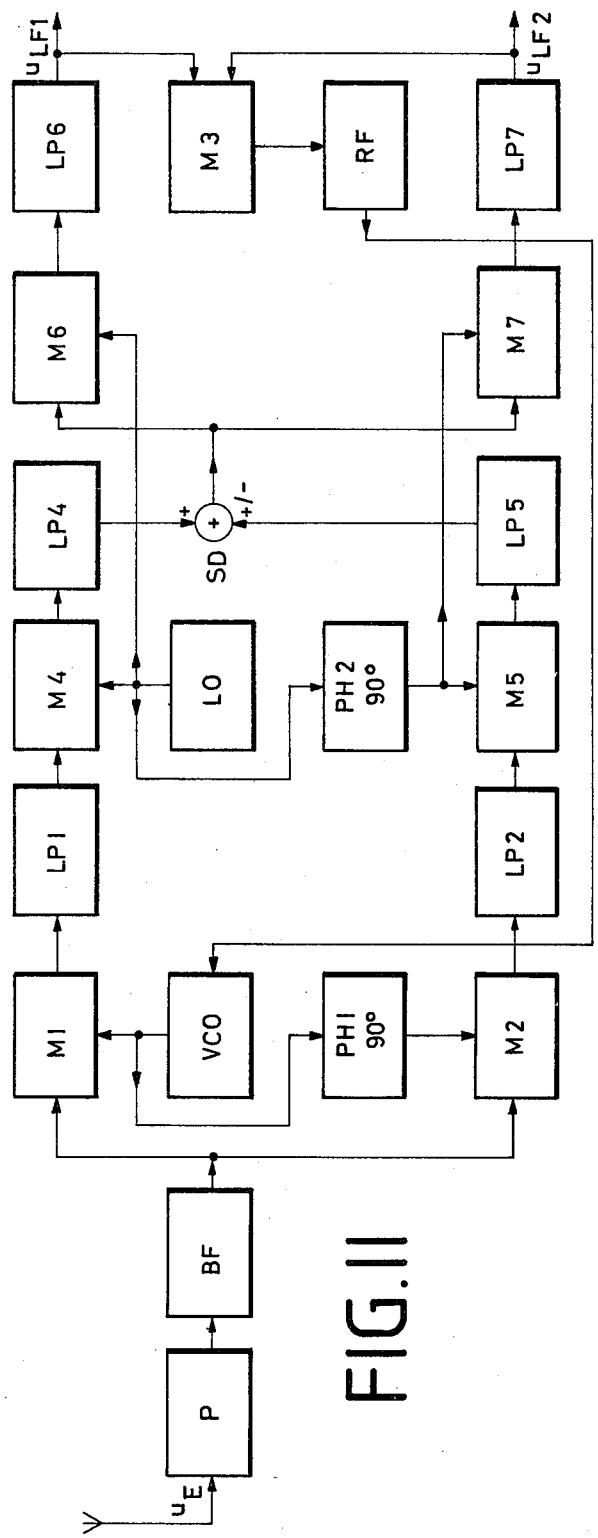
FIGS. 11–13 are block circuit diagrams of further preferred embodiments of receivers according to the invention.

A further possible variation of the receiving circuit according to the invention is shown in FIG. 11 in which compensation of the interference is effected within the Costas loop. The circuit shown in FIG. 11 is essentially the circuit of FIG. 8 supplemented by the compensation block of FIG. 10, together with a further mixer M7 having its inputs connected to the output of arithmetic unit SD and the output of phase shifter PH2, and two further lowpass filters LP6 and LP7, each connected to the output of a respective one of mixers M6 and M7. In addition, in FIG. 11 the inputs to mixer M3 are connected to the outputs of the latter filters LP6 and LP7.

The directly mixing receivers according to the present invention are characterized by a higher sensitivity and usually better separation than superheterodyne receivers. However, this superiority can be utilized only if a number of structural and dimensioning rules are adhered to.

The following criteria apply for the mixer M1 and for the mixer M2, if employed:

1. The local oscillator (VCO) signal must be strongly decoupled from the HF input. This requires, as an optimum solution, a design of the mixer in a bridge or double bridge structure.

2. At the output of the mixer only the product of the two signals to be mixed should be formed. Signals at other combination frequencies, the signals to be mixed themselves and their harmonics should be strongly suppressed. Thus a push-pull structure should be provided.

3. The mixer output must be capable of processing frequencies from direct current up to values of at least one channel bandwidth, that is the maximum bandwidth of the signal to be received, e.g. 210 kHz for FM-broadcasting, without incurring any significant amount of phase distortion. A signal level dependent direct voltage value must be avoided.

4. The mixers must be low in noise. Particular emphasis must be placed on low 1/f noise on the low frequency side.

5. The operating points of the mixers must be set so that the output signal amplitude depends linearly on the input signal amplitude and linearly or at most slightly nonlinearly respectively, on the local oscillator or mixed signal amplitude, respectively. When highly frequency selective preamplifiers are used, the latter requirement can be weakened.

The local oscillator (VCO) should satisfy the following requirements:

1. It should be tunable by means of external signals (DC and LF) over the entire frequency band to be received.

2. It should generate harmonic signals with strongly suppressed harmonics.

3. It should have an approximately constant local oscillator amplitude over the entire frequency band to be received; in particular it should have only very slight fluctuations in amplitude within one channel bandwidth.

4. It is unavoidable, that the control input of a voltage controlled oscillator acts as lowpass filter. The limit frequency of this lowpass filter must, when the oscillator is used in phase control circuits, be at least ten times higher than the lowest limit frequency occurring in the control circuit, which will generally require a bridge structure. These other limit frequencies are created by the lowpass filters in the control circuit. There values depend on the actual application.

5. It must be highly stable in frequency.

6. It must have low phase noise.

For the LF portion of the demodulator the following criteria must be observed:

1. Low noise, particularly low 1/f noise.

2. If LF blocks lie within a control loop, they must, on the one hand, have a sufficient gain to permit perfect demodulation and, on the other hand, the loop amplification must not become so high that the loop becomes unstable.

3. Selective means within the LF portion increase HF selectivity. This can sometimes considerably reduce the selectivity requirements for the HF preamplifier, e.g.: high order lowpass filters LP1, LP2 or RF can increase the selectivity of a direct mixing FM-receiver to an extent, that no selective means in the HF portion of the receiver are necessary.

The HF preamplifier P should meet the following criteria:

1. It should be low in reaction, so that the local oscillator signal which may reach the output of the preamplifier is suppressed in the reverse direction.

2. It should be low in noise.

3. It should be high in gain so that the noise factor of the subsequent demodulator will not significantly influence the total noise.

4. It should be highly linear, and particularly the HF signals should not be limited within a given range.

5. For receiving systems without automatic regulation or control of the control circuit parameters, automatic selective HF amplitude regulation should be considered for higher system demands.

If these system rules are adhered to, the not insignificant problems regarding intermodulation behavior, locking on the own oscillator signal, locking on the harmonic of the oscillator signal, locking on signals at the harmonics of the input signal frequency and so on should be avoided.

Directly mixing receiving systems according to the present invention, particularly for angle modulated signals, have the advantages that, contrary to general opinion, no limiting amplifier is required ahead of the demodulator and thus there are no expenditures for preselection and postselection. Moreover, the LF output power of the circuits shown in FIGS. 4 and 6 even without power regulation is independent of the HF signal amplitude if the input signal power does not fall below a minimum power $P_0$. Due to the lowpass filter characteristic, the system bandwidth of these two circuits drops below the LF bandwidth if the input signal power drops to below $P_0$. Thus the output signal to noise ratio is further improved at the expense of the information bandwidth. This adaptive behavior permits communication even if receivers with limiter amplifiers have long failed.

Figure 13:
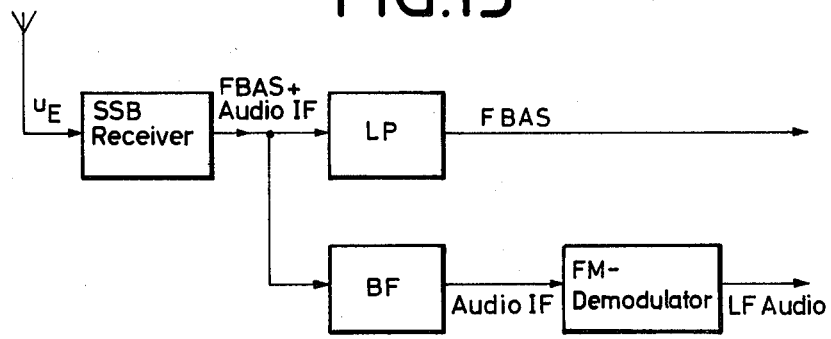

Directly mixing receivers according to the present invention for television signals, one example of which is shown in FIG. 13, also have decisive advantages due to their simple design and mainly due to their particularly simplified matching of the filters which, except for the HF filters, are exclusively lowpass filters, while superheterodyne receivers require tuning of a complicated interconnected combination of resonant circuits.

The circuit shown in FIG. 13 includes a single sideband receiver having the form of one of the receivers disclosed above, for example that shown in FIG. 3. The output of that receiver provides the demodulated combined video signal and the sound IF signal. To separate those signals, there are provided a lowpass filter LP constructed to pass only the combined video signal components and a bandpass filter BF constructed so that the center frequency of its passband is tuned to the audio IF carrier frequency and the width of its passband assures rejection of the combined video signal components. The output of filter BF is connected to an FM demodulator which can be of a conventional type or a synchronous demodulator according to the invention, e.g. that shown in FIG. 4.

As a result of the elimination of the intermediate frequency stage, receivers according to the present invention also have no problems regarding image frequency stability and intermediate frequency stability.

The proposed systems are easily adaptable to miniaturization according to integrated circuit techniques.

EMBODIMENTS OF BLOCK CIRCUITS ILLUSTRATED IN FIGS. 2-13

1. Preamplifiers

As low noise broad band preamplifiers, amplifier modules like optimax AH-461 or ADH-559 from Alpha Industries Inc., Woburn, Mass., or different models of other manufactures can be used.

2. Mixers

Figure 14:
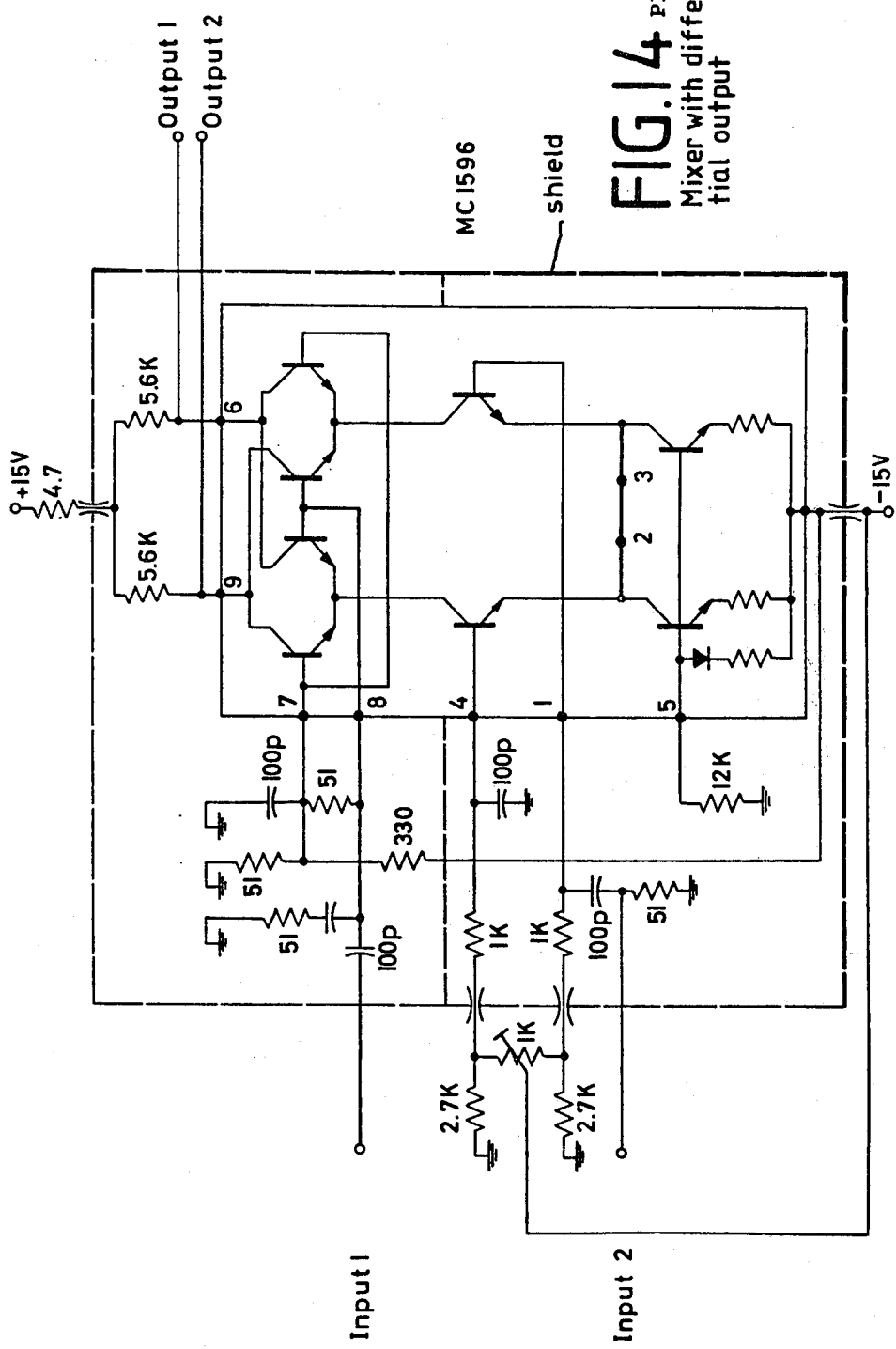

Ring modulators are the most preferred mixers for the purposes of the circuits given in FIGS. 2-13. For high-frequency application, double-balanced bridge mixers with semiconductor diodes like model MD-142 from Anzac Electronics, Waltham, Mass., or different models of other manufactures can be used. For frequencies up to 200 MHz, integrated circuit ring modulators like MC 1596 from Motorola Semiconductors Inc., Phoenix, Ariz. or different models of other manufactures are applicable. FIG. 14 shows an embodiment with MC 1596 designed for frequencies about 100 MHz. For audio frequency applications, integrated circuits like Motorola MC 1594L or MC 1595L or different models of other manufactures can be used, typical embodiments of such of multipliers are described in: *The Semiconductor Data Library*, Vol. VI, edited by Motorola Semiconductors Inc., in the description of the integrated circuits MC 1594L and MC 1595 L.

3. Voltage controlled oscillators

Figure 15:
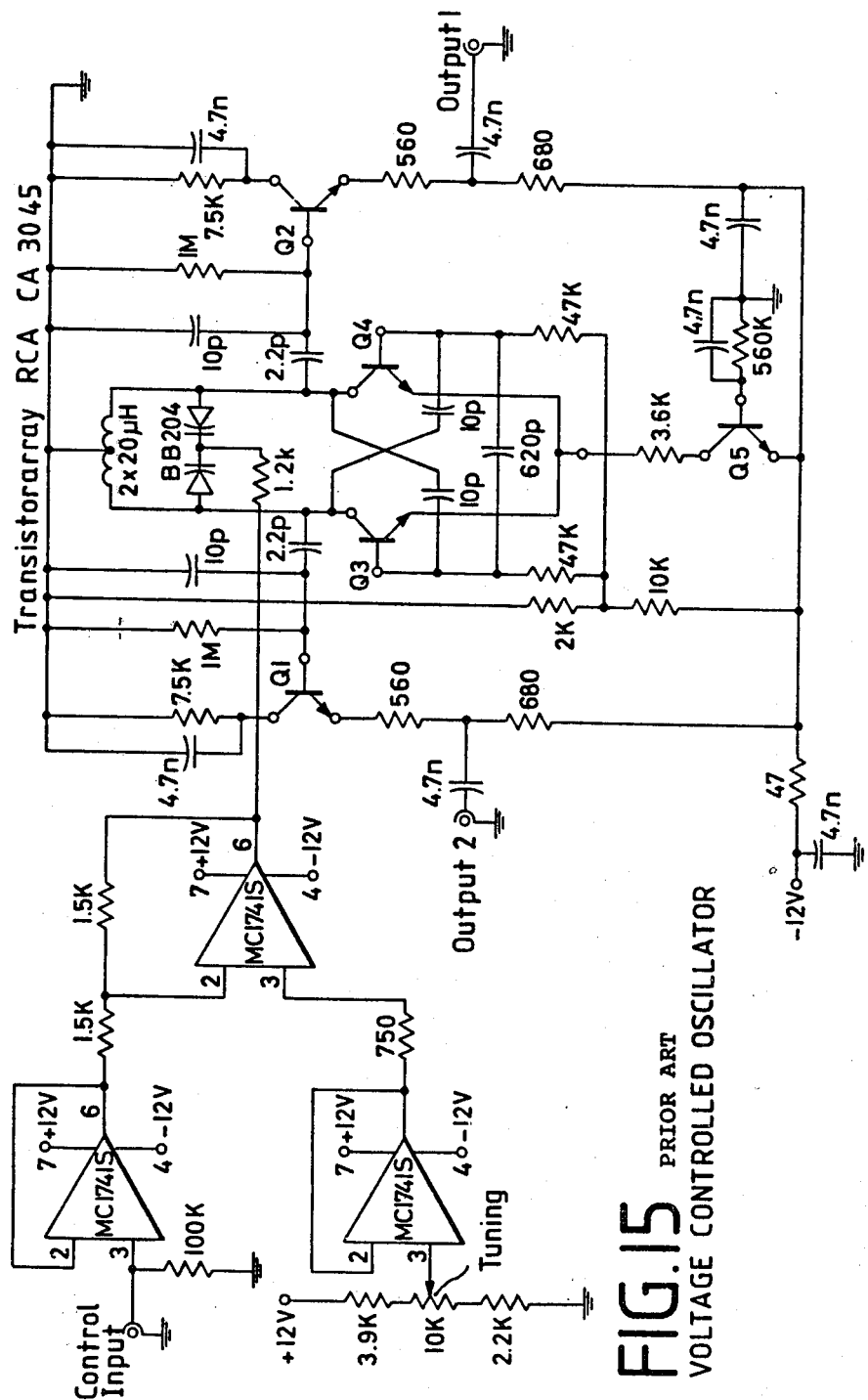

FIG. 15 shows the circuit diagram of a voltage controlled oscillator designed for frequencies of about 5.5 MHz. With the same circuit structure, it is possible to construct oscillators up to the UHF-range. Other oscillator structures are also applicable.

4. DC- and LF-amplifiers, integrators, summing amplifiers

For purposes of DC- and LF-amplification, integration and summation, circuits with operational amplifiers can be used for frequencies up to about 100 kHz. Circuit structures for these applications are given in the literature, e.g. J. Wait, L. Huelsman, G. Korn, *Introduction to Operational Amplifiers Theory and Applications*, McGraw-Hill, New York, 1975. Low noise operational amplifiers like μA 739 from Fairchild Semiconductor, Mountain view, Calif., or amplifiers with similar properties should be taken. FIG. 20 shows a typical DC- and LF-amplifier with differential input. For video amplifier applications, integrated amplifiers with Fairchild μA 733 can be used.

5. Control filters

FIGS. 16 and 17 show two typical control filters. Each of them can be used to form the control filter block RF of the circuits of FIGS. 3, 5-8, 11, 12. In the control filter of FIG. 17, an operational amplifier is used. One possible realization is the integrated circuit Fairchild μA 739.

6. Other filters

As lowpass and bandpass filters, similar constructed filters, as they are used in state-of-the-art receivers, are applicable.

7. 90° phase shifter

As 90° phase shifter, a quadrature hybrid can be used. A typical realization is the hybrid JH-131 from Anzac Electronics, Waltham, Mass. The phases of the output signals of quadrature hybrids differ about 90° at specified input frequencies. FIG. 18 shows a realization, as it can be used in the circuits of FIGS. 7-8, 10-12.

8. Phase modulator

Figure 19:
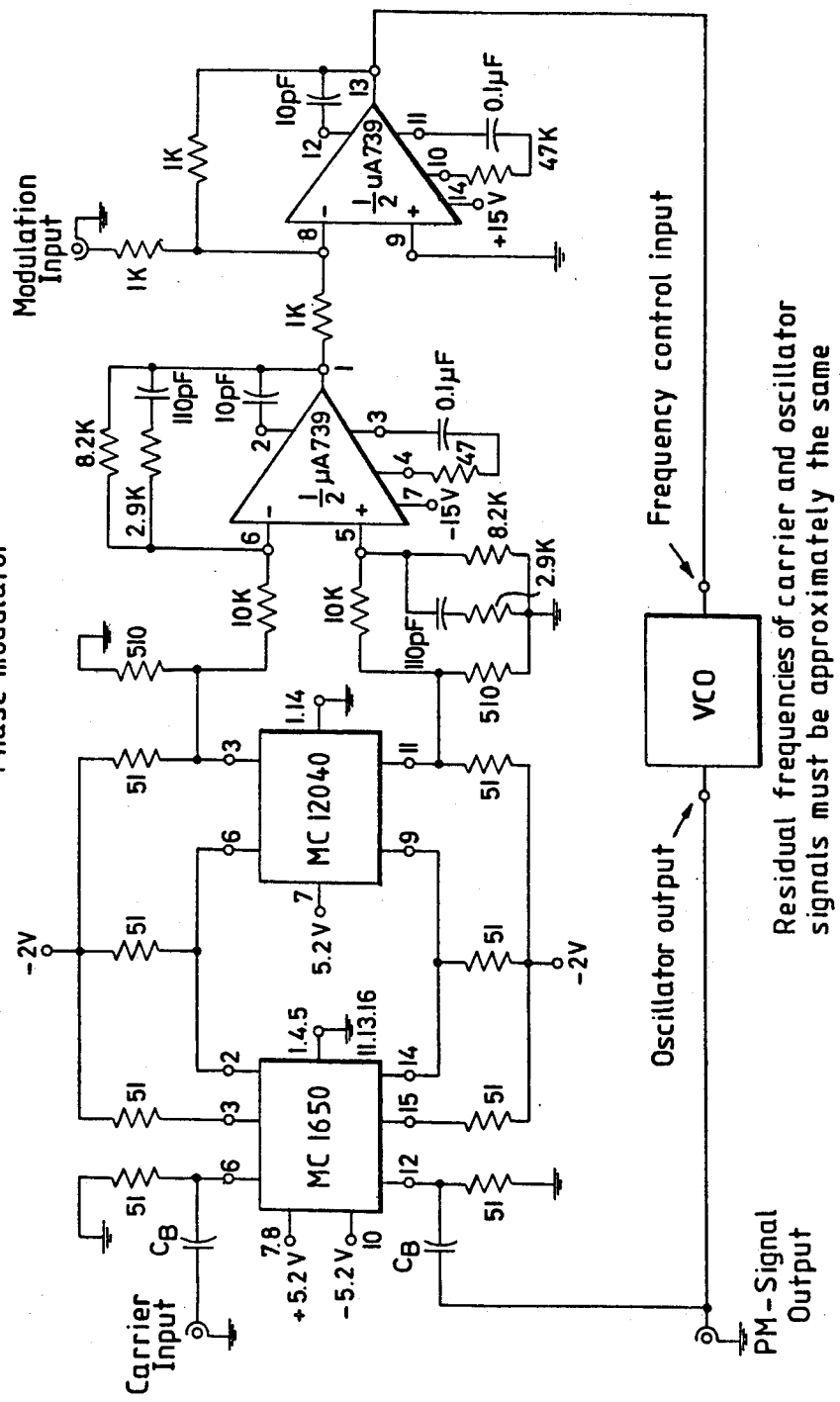

FIG. 19 shows a circuit diagram of a special phase modulator. It contains a voltage controlled oscillator, the residual frequency of which must be approximately the same as the residual frequency of the carrier to be modulated. Possible embodiments of voltage controlled oscillators are described above. The phase modulator of FIG. 19 is useful for frequencies up to 80 MHz. Its advantage is a highly linear phase-voltage transfer characteristic with maximum phase deviations up to $\pm 2\pi$.

With the aid of frequency multipliers (described in: V. Kroupa, *Frequency Synthesis*, Griffin & Cie., Ltd., London, 1973, chapter 2) it is possible to exceed the frequency and phase deviation range of the described phase modulator.

It will be understood that the above description of the present invention is susceptible to various modifications, changes and adaptations, and the same are intended to be comprehended within the meaning and range of equivalents of the appended claims.

What is claimed is:

1. A directly mixing broadcast signal receiving system, in which a received modulated high frequency signal is directly demodulated into a demodulated low frequency base band signal by mixing with a synchronized local oscillator signal, said system including a phase control loop comprising a first mixer having first and second inputs and an output and arranged to provide at said output a signal proportional to the algebraic product of the signals applied to said first and second inputs and including high frequency and low frequency components, means connected for delivering the received modulated high frequency signal to said first input of said first mixer, a voltage controlled oscillator having an input and an output, with said output being connected for supplying to said second input of said first mixer an alternating voltage of substantially constant amplitude and having a frequency which is a function of the voltage at said oscillator input, a first lowpass filter connected to said output of said first mixer for providing a filtered output signal representative of said first mixer output signal with the high frequency component of said first mixer output signal substantially suppressed, and means for applying the filtered output signal of said first lowpass filter to said input of said voltage controlled oscillator, wherein said first mixer comprises means for decoupling its output signal from said first input, said first mixer and first lowpass filter comprise means for suppressing all frequency components other than that of the algebraic product of the signals to be mixed, said voltage controlled oscillator is constructed to be tuned over a predetermined band of high frequencies to be received, the output signal of said voltage controlled oscillator is substantially sinusoidal and the mixed output signal produced by said first mixer is low in harmonics, whereby the received modulated high frequency signal is directly demodulated by said phase control loop without the aid of an intermediate frequency signal.

2. An arrangement as defined in claim 1 wherein: the received signal is a single sideband amplitude modulated signal; said means for delivering the received signal comprise a tunable bandpass filter tuned to the received signal and connected ahead of said first input of said first mixer; and the filtered output signal from said first lowpass filter constitutes the demodulated output of said system.

3. An arrangement as defined in claim 1 wherein: the received signal is a phase modulated signal with small maximum phase deviation; said system further comprises a second lowpass filter connected to the output of said first lowpass filter; and the output signal from said second lowpass filter constitutes the demodulated output of said system.

4. An arrangement as defined in claim 1 wherein: the received signal is a broadband phase modulated signal; said system further comprises an integrator connected for producing a signal representative of the time integral of the output signal from said first filter and a phase modulator connected between said oscillator and the other input of said first mixer and having a control input connected to the output of said integrator for causing the alternating voltage supplied to the other input of said first mixer to be the oscillator output signal phase modulated by the output signal from said integrator; and the output signal from said integrator constitutes the demodulated output of said system.

5. An arrangement as defined in claim 2, 3 or 4 wherein said filtered output signal applying means has a lowpass characteristic and said oscillator input has a lowpass characteristic with a limit frequency which is equal to at least ten times the lowest one of the limit frequencies of said first lowpass filter and said filtered output signal applying means.

6. An arrangement as defined in claim 5 wherein said phase control loop further comprises a control filter connected between the output of said first lowpass filter and said oscillator for controlling the output signal of said oscillator.

7. An arrangement as defined in claim 5 wherein said first lowpass filter comprises a low noise d.c. and low frequency amplifier connected between the output of said first mixer and said oscillator.

8. An arrangement as defined in claim 1 wherein said first mixer comprises a bridge circuit.

9. An arrangement as defined in claim 1 wherein said first mixer is low in noise and has a linear transfer characteristic concerning the amplitudes of the signals to be mixed.

10. An arrangement as defined in claim 1 wherein said voltage controlled oscillator is arranged to be tuned in response to d.c. and low frequency signals.

11. An arrangement as defined in claim 1 wherein the output signal of said voltage control oscillator has an amplitude which is approximately constant over the entire receiving frequency band, and said oscillator has high frequency and phase stability.

12. An arrangment as defined in claim 1 wherein said means for delivering the received signal comprises a high frequency input preamplifier connected to said first input of said first mixer and having a low reactive effect and low noise, high gain and further having at least one of high linearity and no limitation within a given range and automatic selective amplitude regulation.

13. An arrangement as defined in claim 1 for receiving an amplitude modulated signal and further comprising: a second mixer having two inputs and an output and arranged to provide at its output a signal proportional to the product of the signals applied to its two inputs; means connected for delivering the received high frequency signal to one input of said second mixer; phase shifting means connected between the output of said voltage controlled oscillator and the other input of said second mixer for supplying thereto the alternating voltage from said oscillator shifted in phase by approximately 90°; and a second lowpass filter connected to the output of said second mixer for supplying the demodulated signal.

14. An arrangement as defined in claim 1 further comprising: a second mixer having first and second inputs and an output and arranged to provide at its output a signal proportional to the algebraic product of the signals applied to said first and second inputs of said second mixer and containing high frequency and low frequency components, said first input of said second mixer being connected to said first input of said first mixer; phase shifting means connected between the output of said voltage controlled oscillator and said second input of said second mixer for supplying thereto the alternating voltage from said oscillator shifted in phase by approximately 90°; a second lowpass filter connected to the output of said second mixer for supplying a filtered output signal representative of the second mixer output signal with the high frequency component of said second mixer output signal substantially suppressed; and compensator means having inputs connected to the outputs of said two lowpass filters and an output supplying the demodulated output of said system, and wherein said means for delivering the received signal comprise a bandpass filter connected ahead of said first input of each of said mixers, and said filtered output signal applying means comprises a third mixer having two inputs and an output, each input being connected to the output of a respective one of said first and second lowpass filters, and arranged to provide at its output a signal proportional to the product of the signals applied to its two inputs, and a control filter connected between the output of said third mixer and said voltage controlled oscillator input for providing a signal which controls the alternating voltage supplied by said oscillator.

15. An arrangement as defined in claim 14 wherein said compensator means comprise a second phase shifting means connected for shifting the signal at one of the inputs of said compensator means in phase by 90° and an arithmetic unit connected for producing a signal proportional to the sum or difference of the signal applied to the other input of said compensator means and the signal produced by said second phase shifting means.

16. An arrangement as defined in claim 14 wherein said compensator means comprise: a fixed frequency local oscillator producing an alternating signal at a frequency slightly higher than the highest modulating signal frequency; a fourth mixer having a first input connected to the output of said first lowpass filter, a second input connected to receive the signal from said local oscillator, and an output and arranged to provide at its output a signal proportional to the product of the signals applied to its two inputs; a third lowpass filter connected to the output of said fourth mixer for supplying the lower frequency component and suppressing the higher component of the signal at said fourth output; a phase shifting device connected to shift the alternating signal from said local oscillator in phase by 90°; a fifth mixer having a first input connected to the output of said second lowpass filter, a second input connected to the output of said phase shifting device, and an output and arranged to provide at its output a signal proportional to the product of the signals applied to its two inputs; a fourth lowpass filter connected to the output of said fifth mixer for supplying the lower frequency component and suppressing the higher component of the signal at said fifth mixer output; an arithmetic member having two inputs each connected to receive the output signal from a respective one of said third and fourth filters for producing a signal proportional to the sum or difference of the signals applied to its two inputs; a sixth mixer having a first input connected to receive the signal produced by said arithmetic unit, a second input connected to receive the signal from said local oscillator, and an output and arranged to provide at its output a signal proportional to the product of the signals applied to its two inputs, and a fifth lowpass filter connected to the output of said sixth mixer for passing the lower frequency component of the signal at said sixth mixer output.

17. An arrangement as defined in claim 1 wherein:
said control loop comprises: a second mixer having two inputs and an output and arranged to provide at its output a signal proportional to the product of the signals applied to its two inputs, one of the inputs of said second mixer being connected to the one input of said first mixer; first phase shifting means connected between the output of said voltage controlled oscillator and the other input of said second mixer for supplying thereto the alternating voltage from said oscillator shifted in phase by 90°; a second lowpass filter connected to the output of said second mixer for supplying a filtered output signal representative of the second mixer output signal with the sum frequency component of that signal suppressed; and compensator means having inputs connected to the outputs of said two lowpass filters,
said means for delivering the received signal comprise a bandpass filter connected ahead of the one input of each of said first and second mixers,
said control loop further comprises: a third mixer having two inputs and an output and arranged to provide at its output a signal proportional to the product of the signals applied to its two inputs; and a control filter connected between the output of said third mixer and said voltage controlled oscillator for providing a signal which controls the phase and frequency of the alternating voltage supplied by said oscillator;
said compensator means comprise: a fixed frequency local oscillator producing an alternating signal at a frequency slightly higher than the highest modulating signal frequency; a fourth mixer having a first input connected to the output of said first lowpass filter, a second input connected to receive the signal from said local oscillator, and an output and arranged to provide at its output a signal proportional to the product of the signals applied to its two inputs; a third lowpass filter connected to the output of said fourth mixer for supplying the lower frequency component and suppressing the higher component of the signal at said fourth mixer output; second phase shifting means connected to shift the alternating signal from said local oscillator in phase by 90°; a fifth mixer having a first input connected to the output of said second lowpass filter, a second input connected to the output of said second phase shifting means, and an output and arranged to provide at its output a signal proportional to the product of the signals applied to its first two inputs; a fourth lowpass filter connected to the output of said fifth mixer for supplying the lower frequency component and suppressing the higher component of the signal at said fifth mixer output; an arithmetic unit having two inputs each connected to the output of a respective one of said third and fourth lowpass filters for producing an output signal proportional to the sum or difference of the signals applied to its two inputs; a sixth mixer having a first input connected to receive the signal produced by said arithmetic unit, a second input connected to receive the signal from said local oscillator, and an output and arranged to provide at its output a signal proportional to the product of the signals applied to its two inputs; and a fifth lowpass filter connected to the output of said sixth mixer for passing the lower frequency component and suppressing the higher frequency component of the signal at said sixth mixer output, with the output of said fifth lowpass filter being connected to one input of said third mixer; a seventh mixer having a first input connected to receive the signal produced by said arithmetic unit, a second input connected to the output of said second phase shifting means, and an output and arranged to provide at its output a signal proportional to the product of the signals applied to its two inputs; and a sixth lowpass filter connected to the output of said seventh mixer for passing the lower frequency component and suppressing the higher frequency component of the signal at said seventh mixer output; and the signal supplied by one of said fifth and sixth filters constitutes the demodulated signal.

18. An arrangement as defined in claim 17 wherein said arithmetic unit forms the sum of the signals at its inputs and the signal delivered by said fifth lowpass filter constitutes the demodulated signal.

19. An arrangement as defined in claim 17 wherein said arithmetic unit forms the difference of the signals at its inputs and the signal delivered by said fifth lowpass filter constitutes the demodulated signal.

20. An arrangement as defined in claim 1 for receiving phase modulated signals with a small phase excursion or n-PSK signals and wherein said phase control loop is constructed to constitute a Costas loop.

21. A receiver for a television signal with amplitude modulated video information and frequency modulated audio information, said receiver comprising: a system as defined in claim 1 for receiving a single sideband signal and providing an output signal containing the demodulated video signal and a carrier which is frequency modulated with the audio signal; an additional lowpass filter connected to the output of said system for passing the video signal while rejecting the frequency modulated carrier; a band pass filter having a center frequency corresponding to that of the audio signal carrier and connected to the output of said receiver for passing the frequency modulated carrier while rejecting the video signal; and an FM demodulator connected to the output of said band pass filter for deriving the audio signal from the carrier.

* * * * *